(12) United States Patent
Yamauchi et al.

(10) Patent No.: US 12,308,244 B2
(45) Date of Patent: *May 20, 2025

(54) DRY ETCHING METHOD, METHOD FOR PRODUCING SEMICONDUCTOR DEVICE, AND ETCHING DEVICE

(71) Applicant: Central Glass Company, Limited, Ube (JP)

(72) Inventors: Kunihiro Yamauchi, Ube (JP); Hikaru Kitayama, Ube (JP); Akifumi Yao, Ube (JP)

(73) Assignee: Central Glass Company, Limited, Ube (JP)

( * ) Notice: Subject to any disclaimer, the term of this patent is extended or adjusted under 35 U.S.C. 154(b) by 322 days.

This patent is subject to a terminal disclaimer.

(21) Appl. No.: 17/771,193

(22) PCT Filed: Sep. 1, 2020

(86) PCT No.: PCT/JP2020/033073
§ 371 (c)(1),
(2) Date: Apr. 22, 2022

(87) PCT Pub. No.: WO2021/079624
PCT Pub. Date: Apr. 29, 2021

(65) Prior Publication Data
US 2022/0415667 A1    Dec. 29, 2022

(30) Foreign Application Priority Data
Oct. 23, 2019   (JP) .................. 2019-192524

(51) Int. Cl.
*H01L 21/311*    (2006.01)
*H01L 21/3213*    (2006.01)
*H01L 21/67*    (2006.01)

(52) U.S. Cl.
CPC ............. *H01L 21/31122* (2013.01); *H01L 21/32135* (2013.01); *H01L 21/67069* (2013.01)

(58) Field of Classification Search
None
See application file for complete search history.

(56) References Cited

U.S. PATENT DOCUMENTS 6,284,146 B1   9/2001   Kim et al.
11,335,573 B2*   5/2022   Yamauchi ......... H01L 21/32135
(Continued)

FOREIGN PATENT DOCUMENTS

CN     101386572 A    3/2009
EP      3 933 892 A1    1/2022
(Continued)

OTHER PUBLICATIONS

International Search Report (PCT/ISA/210) issued in PCT Application No. PCT/JP2020/033073 dated Nov. 17, 2020 with English translation (five (5) pages).
(Continued)

*Primary Examiner* — Allan W. Olsen
(74) *Attorney, Agent, or Firm* — Crowell & Moring LLP

(57) ABSTRACT

A dry etching method according to an embodiment of the present disclosure includes reacting an etching target film formed on a surface of a workpiece with a β-diketone and nitrogen dioxide to etch the etching target film in a non-plasma state, the etching target film containing a metal having an M-O bond energy of 5 eV or higher or an oxide of the metal.

23 Claims, 1 Drawing Sheet

(56) References Cited

U.S. PATENT DOCUMENTS

| | | | |
|---|---|---|---|
| 11,618,954 B2* | 4/2023 | Takeda | H01L 21/02312 |
| | | | 438/706 |
| 2004/0110375 A1 | 6/2004 | Chen et al. | |
| 2004/0242012 A1 | 12/2004 | Ikeda | |
| 2005/0107274 A1 | 5/2005 | Daviot | |
| 2005/0142885 A1 | 6/2005 | Shinriki | |
| 2007/0000870 A1 | 1/2007 | Ikeda | |
| 2010/0099264 A1 | 4/2010 | Elers | |
| 2012/0180811 A1 | 7/2012 | Gunji et al. | |
| 2014/0352716 A1 | 12/2014 | Kikuchi et al. | |
| 2015/0047680 A1* | 2/2015 | Umezaki | C23C 16/4405 |
| | | | 134/37 |
| 2015/0099369 A1 | 4/2015 | Deshmukh et al. | |
| 2015/0270140 A1 | 9/2015 | Gupta et al. | |
| 2016/0111294 A1* | 4/2016 | Berry, III | H01L 29/66772 |
| | | | 438/712 |
| 2017/0032990 A1 | 2/2017 | Lin et al. | |
| 2018/0308707 A1 | 10/2018 | Yamaguchi | |
| 2019/0348307 A1* | 11/2019 | Yamauchi | H01L 21/302 |
| 2020/0051828 A1 | 2/2020 | Yamaguchi | |
| 2020/0066541 A1* | 2/2020 | Yamauchi | H01L 21/3205 |
| 2020/0135455 A1 | 4/2020 | Nakatani et al. | |
| 2022/0056593 A1* | 2/2022 | Takeda | C23F 4/00 |

FOREIGN PATENT DOCUMENTS

| | | |
|---|---|---|
| JP | 6-151383 A | 5/1994 |
| JP | 8-153708 A | 6/1996 |
| JP | 2003-86569 A | 3/2003 |
| JP | 2004-91829 A | 3/2004 |
| JP | 2005-101361 A | 4/2005 |
| JP | 2006-310676 A | 11/2006 |
| JP | 2013/194307 A | 9/2013 |
| JP | 2014-236096 A | 12/2014 |
| JP | 2018-110229 A | 7/2018 |
| JP | 2018-186149 A | 11/2018 |
| KR | 10-2012-0083867 A | 7/2012 |
| KR | 10-2014-0124858 A | 10/2014 |
| KR | 10-2014-0141531 A | 12/2014 |
| TW | 201343907 A | 11/2013 |
| TW | 201445634 A | 12/2014 |
| WO | WO 2017/047400 A1 | 3/2017 |
| WO | WO-2017134930 A1 * | 8/2017 | .......... H01L 21/302 |
| WO | WO-2018128078 A1 * | 7/2018 | ................ C23F 1/12 |
| WO | WO-2018128079 A1 * | 7/2018 | ................ C23F 1/08 |
| WO | WO 2019/003662 A1 | 1/2019 |

OTHER PUBLICATIONS

International Search Report (PCT/ISA/210) issued in PCT Application No. PCT/JP2017/045709 dated Jan. 30, 2018 with English translation (5 pages).
Japanese-language Written Opinion (PCT/ISA/237) issued in PCT Application No. PCT/JP2017/045709 dated Jan. 30, 2018 (4 pages).
International Search Report (PCT/ISA/210) issued in PCT Application No. PCT/JP2017/045708 dated Feb. 13, 2018 with English translation (7 pages).
Japanese-language Written Opinion (PCT/ISA/237) issued in PCT Application No. PCT/JP2017/045708 dated Feb. 13, 2018 (4 pages).
Chinese-language Office Action issued in Taiwanese Application No. 107100152 dated Dec. 7, 2018 (8 pages).
Chinese-language Office Action issued in Taiwanese Application No. 107100151 dated Dec. 7, 2018 (8 pages).
U.S. Non-Final Office Action issued in U.S. Appl. No. 16/461,600 dated Feb. 19, 2020 (11 pages).
Korean-language Office Action issued in Korean Application No. 10-2019-7022860 dated Nov. 29, 2020 with English translation (17 pages).
Korean-language Office Action issued in Korean Application No. 10-2019-7022865 dated Nov. 29, 2020 with English translation (17 pages).
Jain, A. et al., "Thermal Dry-Etching of Copper Using Hydrogen Peroxide and Hexafluoroacety Lacetone", Thin Solid Films Elsevier Advanced Technology, Nov. 15, 1995, pp. 51-56, vol. 296, No. 1 (6 pages).

* cited by examiner

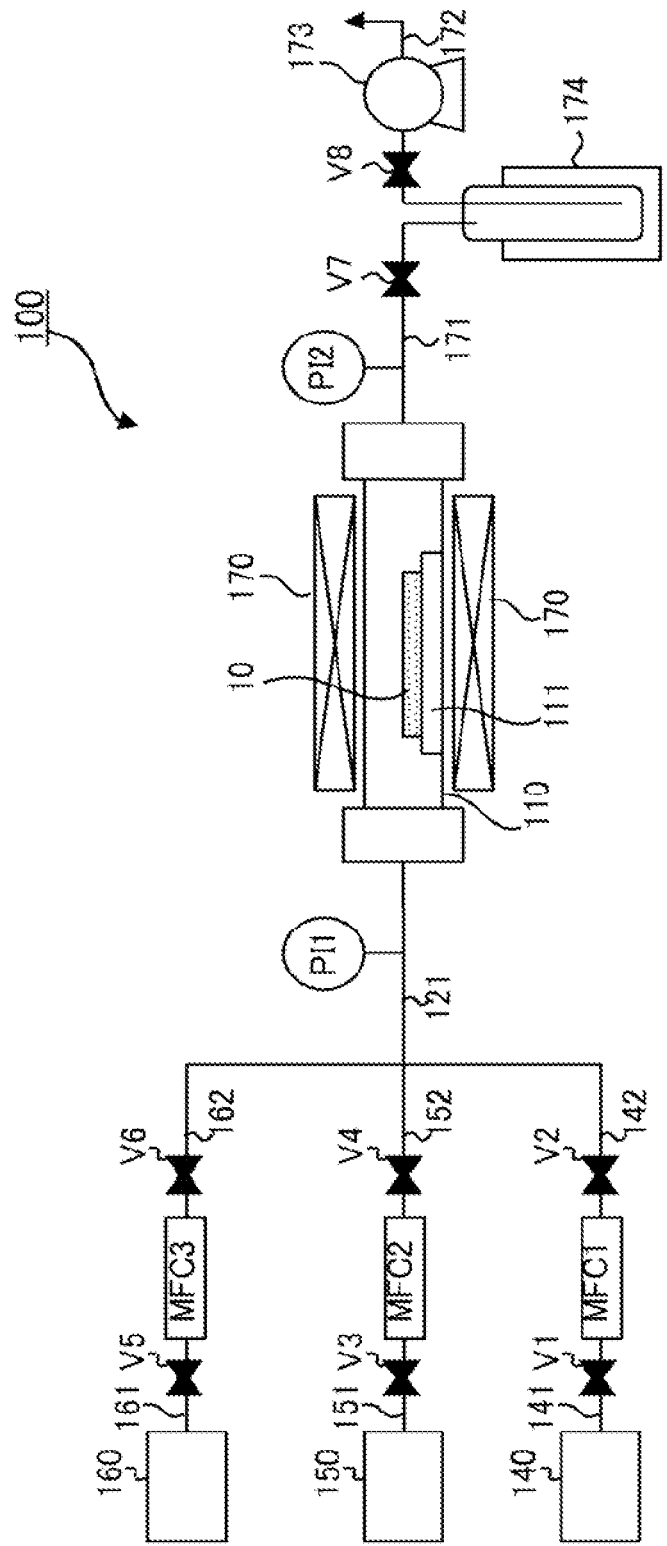

DRY ETCHING METHOD, METHOD FOR PRODUCING SEMICONDUCTOR DEVICE, AND ETCHING DEVICE

TECHNICAL FIELD

The present disclosure relates to dry etching methods, methods of producing semiconductor devices, and etching devices.

BACKGROUND ART

As the circuit patterns of semiconductor devices are becoming finer, field effect transistors are also becoming smaller. This has led to consideration of forming gate insulating films from $HfO_2$ (dielectric constant k=25), one of the high dielectric constant (high-k) materials, instead of SiO2 (dielectric constant k=3.9).

Forming gate insulating films from high dielectric constant materials requires etching of formed films into predetermined shapes.

For the methods of producing MOS transistors and the like, Patent Literature 1 discloses a method of etching a metal film and a metal oxide film that are formed on a substrate and that contain at least one of Al, Zr, Hf, Y, La, Ce, or Pr. The method uses β-diketone-containing etching gas so as to reduce damage on the substrate. The examples disclose a method of etching a $HfO_2$ film at a wafer temperature of about 450° C. using hexafluoroacetylacetone gas containing oxygen.

For the methods of producing semiconductor devices, Patent Literature 2 discloses a method of etching a sample of a high relative dielectric constant film, such as an oxide of hafnium, formed on a Si film. This method excites a CH-type etching gas, which contains C and H, to a plasma state to etch the high relative dielectric constant film.

Patent Literature 3 discloses a method of cleaning off a metal film adhering to a film-forming device using a gas containing a β-diketone and NO or $N_2O$, wherein the film-forming device forms a film of a metal gate material, an electrode material, or a magnetic material on a substrate surface.

CITATION LIST

Patent Literature

Patent Literature 1: JP 2004-91829 A
Patent Literature 2: JP 2006-310676 A
Patent Literature 3: JP 2013-194307 A

SUMMARY OF INVENTION

Technical Problem

As described above, as the circuit patterns of semiconductor devices are becoming finer, techniques have been developed to use high dielectric constant materials as gate insulating films. However, many high dielectric constant materials such as oxides of hafnium are etch-resistant materials.

The invention of Patent Literature 1 discloses that the etching gas preferably contains at least one of water or alcohol in addition to oxygen, and that etching does not proceed at a low wafer temperature of 400° C. or lower. Specifically, FIG. 9 of Patent Literature 1 shows that etching using a gas mixture of hexafluoroacetylacetone and oxygen does not proceed at a wafer temperature of 400° C. or lower. Performing an etching step at a wafer temperature of higher than 400° C. causes great damage on semiconductor devices. Thus, there is a demand for a method that can etch an oxide of hafnium at a low temperature of 400° C. or lower, more preferably 300° C. or lower.

Patent Literature 2 discloses that $C_2H_2$ used as a plasma etching gas has provided an etching rate of 1.0 nm/min. However, plasma etching methods not only cause plasma damage on portions other than etching targets on semiconductor devices, but also require RF power sources for generating plasma, making equipment expensive. There is thus a demand for a method that does not use plasma. Patent Literature 3 describes only a cleaning method for metal films, and does not disclose any example of etching of $HfO_2$.

In view of the above problems, the present disclosure aims to provide a dry etching method using a gas composition that enables non-plasma, low-temperature etching of specific types of metal oxide film or metal film including films of oxides of hafnium. The present disclosure also aims to provide, among others, a method of producing a semiconductor device by the dry etching method.

Solution to Problem

The present inventors have found out that etching of a particular metal oxide film or metal film such as a film of an oxide of hafnium specifically proceeds even at a temperature of 400° C. or lower, or even 300° C. or lower when using nitrogen dioxide as an additive gas for a β-diketone as compared with when using other additive gases. The inventors thus have arrived at the present disclosure.

The dry etching method of the present disclosure includes reacting an etching target film formed on a surface of a workpiece with a β-diketone and nitrogen dioxide to etch the etching target film in a non-plasma state, the etching target film containing a metal having an M-O bond energy of 5 eV or higher or an oxide of the metal.

M-O bond energy is the difference in potential energy between the state where the metal exists as a metal and the state where the metal exists as a metal oxide. A greater M-O bond energy indicates a stronger bond between the metal and oxygen.

A metal having an M-O bond energy of 5 eV or higher strongly bonds with oxygen, and forms a stable, etch-resistant metal oxide. The metal itself is also considered etch-resistant because the metal is easily oxidized by nitrogen dioxide, and thus etching the metal is substantially etching a metal oxide. However, the dry etching method of the present disclosure can etch the metal or metal oxide even at 300° C. or lower.

In the dry etching method of the present disclosure, examples of the metal having an M-O bond energy of 5 eV or higher include hafnium, zirconium, titanium, and aluminum. Examples of oxides of these metals include oxides of hafnium, oxides of zirconium, oxides of titanium, and oxides of aluminum. These metals may be used alone, or alloys containing two or more of them may be used. Thus, oxides of these metals may be oxides of one metal or oxides of alloys containing two or more of these metals.

Either a first dry etching method or a second etching method may be used as the dry etching method of the present disclosure: the first dry etching method includes bringing an etching gas A containing the β-diketone and the nitrogen dioxide into contact with the etching target film; and the second dry etching method includes a first etching step of bringing an etching gas B containing the nitrogen dioxide into contact with the etching target film and a second etching step of bringing an etching gas C containing the β-diketone into contact the etching target film.

The method of producing a semiconductor device of the present disclosure includes a step of reacting an etching target film on a substrate with a β-diketone and nitrogen dioxide to etch the etching target film in a non-plasma state, the etching target film containing a metal having an M-O bond energy of 5 eV or higher or an oxide of the metal.

Also in the method of producing a semiconductor device of the present disclosure, either the first dry etching method or the second dry etching method may be used.

The etching device of the present disclosure includes: a placement unit which is provided in a processing container capable of being heated and on which a workpiece with an etching target film formed on a surface thereof is to be placed, the etching target film containing a metal having an M-O bond energy of 5 eV or higher or an oxide of the metal; a β-diketone supply unit configured to supply a β-diketone to the workpiece; and a nitrogen dioxide gas supply unit configured to supply nitrogen dioxide to the workpiece.

Advantageous Effects of Invention

The dry etching method of the present disclosure can provide a dry etching method that can etch an etch-resistant etching target film containing the metal having an M-O bond energy of 5 eV or higher or the oxide of the metal at a temperature of 400° C. or lower, or even 300° C. or lower, in a non-plasma state.

The dry etching method of the present disclosure can provide a dry etching method having the same effects described above either when using the first dry etching method or when using the second dry etching method.

The method of producing a semiconductor device of the present disclosure can provide a method of producing a semiconductor device that can etch an etch-resistant etching target film containing the metal having an M-O bond energy of 5 eV or higher or the oxide of the metal on a substrate at a temperature of 400° C. or lower, or even 300° C. or lower, in a non-plasma state.

The method of producing a semiconductor device of the present disclosure can provide a method of producing a semiconductor device that has the same effects described above either when using the first dry etching method or when using the second dry etching method.

The etching device of the present disclosure can etch an etch-resistant etching target film containing the metal having an M-O bond energy of 5 eV or higher or the oxide of the metal at a temperature of 400° C. or lower, or even 300° C. or lower, in a non-plasma state.

The etching device of the present disclosure can provide the same effects described above either when using the first dry etching method or when using the second dry etching method.

BRIEF DESCRIPTION OF DRAWINGS

FIG. 1 is a schematic view illustrating an etching device according to one embodiment of the present disclosure.

DESCRIPTION OF EMBODIMENTS

Hereinafter, embodiments of the present disclosure are described in detail.

The present disclosure is not limited to the following embodiments, and can be modified as appropriate without changing the gist of the present disclosure.

[Dry Etching Method]

The dry etching method of the present disclosure includes reacting an etching target film formed on a surface of a workpiece with a β-diketone and nitrogen dioxide to etch the etching target film in a non-plasma state, the etching target film containing a metal having an M-O bond energy of 5 eV or higher or an oxide of the metal.

The metal having an M-O bond energy of 5 eV or higher or the oxide of the metal is preferably at least one selected from the group consisting of an oxide of hafnium, an oxide of zirconium, an oxide of titanium, an oxide of aluminum, hafnium metal, zirconium metal, titanium metal, and aluminum metal.

The etching target film containing the metal having an M-O bond energy of 5 eV or higher or the oxide of the metal is preferably at least one film selected from the group consisting of a film of an oxide of hafnium, a film of an oxide of zirconium, a film of an oxide of titanium, a film of an oxide of aluminum, a hafnium metal film, a zirconium metal film, a titanium metal film, and an aluminum metal film.

The etching target film may be a film of any of the above single metals or the metal oxides, or a film of an alloy containing two or more of the metals or an oxide of the alloy.

The dry etching method of the present disclosure can provide a dry etching method that can etch an etch-resistant etching target film containing the metal having an M-O bond energy of 5 eV or higher or the oxide of the metal at a temperature of 400° C. or lower, or even 300° C. or lower, in a non-plasma state.

Hexafluoroacetylacetone (hereinafter also referred to as HFAc), a β-diketone, has a decomposition temperature of 375° C. At an etching temperature of higher than 400° C. as disclosed in Patent Literature 1, HFAc may decompose and the carbon component may accumulate on the etching target film to be etched. It is fully expected that this causes inconvenience in the subsequent processes.

In contrast, the dry etching method of the present disclosure can reduce the formation of carbon film caused by the decomposition of HFAc because the use of HFAc and $NO_2$ as etching gases makes it possible to decrease the etching temperature to 375° C. or lower.

The reason that the etching temperature can be decreased is presumably as follows: the $NO_2$ constituting the etching gas is adsorbed onto the surface of the etching target film, weakening the bonding strength between the metal and the oxygen constituting the metal oxide. This improves reactivity with HFAc, enabling etching at low temperature.

[First Dry Etching Method]

A first dry etching method is first described as the dry etching method of the present disclosure. The first dry etching method includes bringing an etching gas A containing the β-diketone and the nitrogen dioxide into contact with the etching target film.

In the first dry etching method of the present disclosure, examples of the workpiece include silicon substrates, compound semiconductor substrates, quartz substrates, and glass substrates. On a surface of the workpiece may be formed, in addition to the film containing the metal having an M-O bond energy of 5 eV or higher or the oxide of the metal, a silicon film, a film of an oxide of silicon, a film of nitride of silicon, or a wiring film of a metal other than the metal. The workpiece is placed on a placement unit. The placement unit is heated to heat the workpiece and the etching target film that is formed on the surface of the workpiece and that contains the metal having an M-O bond energy of 5 eV or higher or the oxide of the metal.

The temperature of the workpiece is substantially equal to the temperature of the etching target film. Bringing an etching gas containing a β-diketone and nitrogen dioxide into contact with the etching target film in a heated state causes reaction of the β-diketone, the nitrogen dioxide, and the metal having an M-O bond energy of 5 eV or higher or the oxide of the metal, forming a complex on the etching target film. This complex, which has a high vapor pressure, can etch the etching target film when it evaporates.

Examples of the oxide of hafnium constituting the oxide of the metal having an M-O bond energy of 5 eV or higher include hafnium oxide ($HfO_x$, wherein x is 1 or greater and 3 or smaller, particularly $HfO_2$), hafnium silicon oxides, and hafnium aluminum oxides. Examples of the hafnium silicon oxides include $Hf_{1-x}Si_xO_y$ and $Hf_{1-x}Si_xO_yN_z$. Examples of the hafnium aluminum oxides include $Hf_{1-x}Al_xO_m$ and $Hf_{1-x}Al_xO_mN_n$. Here, x, y, z, m, and n satisfy $0<x<1$, $0<y≤2$, $0<z≤1.33$, $0<m≤1.5$, and $0<n≤1$.

Examples of oxides of zirconium include zirconium oxide ($ZrO_u$, wherein u is 1 or greater and 3 or smaller, particularly $ZrO_2$). Examples of oxides of aluminum include aluminum oxide ($AlO_v$, wherein v is 1 or greater and 2 or smaller, particularly $Al_2O_3$). Examples of oxides of titanium include titanium oxide ($TiO_w$, wherein w is 1 or greater and 3 or smaller, particularly $TiO_2$).

The etching target film containing the metal having an M-O bond energy of 5 eV or higher or the oxide of the metal may be formed on a surface of the workpiece by any method. Examples of the method include a chemical vapor deposition (CVD) method and a sputtering method. The etching target film containing the metal having an M-O bond energy of 5 eV or higher or the oxide of the metal may have any thickness. For example, the etching target film may have a thickness of 0.1 nm or more and 1 μm or less.

Any β-diketone may be used. Examples thereof include hexafluoroacetylacetone (HFAc, 1,1,1,5,5,5-hexafluoro-2,4-pentanedione) and trifluoroacetylacetone (1,1,1-trifluoro-2,4-pentanedione). One compound or two or more compounds may be used as the β-diketone.

The volume ratio of the β-diketone to the nitrogen dioxide in the etching gas A preferably satisfies β-diketone:nitrogen dioxide=10:0.001 or more and 100 or less, more preferably β-diketone:nitrogen dioxide=10:0.01 or more and 10 or less, still more preferably β-diketone:nitrogen dioxide=10:0.1 or more and 10 or less. Too little β-diketone in the etching gas tends to decrease the etching rate, whereas too much β-diketone makes the etching gas too expensive. Moreover, either too little or too much nitrogen dioxide in the etching gas slows the progress of etching.

The etching gas A may consist only of the β-diketone and the nitrogen dioxide, or may further contain at least one additive gas selected from the group consisting of $O_2$, NO, $N_2O$, CO, $CO_2$, $H_2O$, $H_2O_2$, and alcohol. The etching gas A may further contain at least one inert gas selected from the group consisting of $N_2$, Ar, He, Ne, and Kr. Examples of alcohols that can be used include methanol, ethanol, propanol, and isopropyl alcohol.

When the etching gas A contains an additive gas other than the nitrogen dioxide, the total content of nitrogen dioxide and the additive gas other than nitrogen dioxide in the etching gas A may be the same as the nitrogen dioxide content mentioned above.

When the etching gas A contains an inert gas, the etching gas A preferably has an inert gas content of 1% by volume or more and 90% by volume or less, more preferably 10% by volume or more and 80% by volume or less, still more preferably 30% by volume or more and 50% by volume or less.

[Second Dry Etching Method]

Next, the second dry etching method is described as the dry etching method of the present disclosure. The second dry etching method includes a first etching step of bringing an etching gas B containing the nitrogen dioxide into contact with the etching target film and a second etching step of bringing an etching gas C containing the β-diketone into contact with the etching target film.

In the second dry etching method of the present disclosure, examples of the workpiece include silicon substrates, compound semiconductor substrates, quartz substrates, and glass substrates, as in the case of the first dry etching method. On a surface of the workpiece may be formed, in addition to the film containing the metal having an M-O bond energy of 5 eV or higher or the oxide of the metal, a silicon film, a film of an oxide of silicon, a film of nitride of silicon, or a wiring film of a metal other than the metal. The workpiece is placed on a placement unit. The placement unit is heated to heat the workpiece and the etching target film that is formed on the surface of the workpiece and that contains the metal having an M-O bond energy of 5 eV or higher or the oxide of the metal.

The temperature of the workpiece is substantially equal to the temperature of the etching target film. Bringing an etching gas B containing the nitrogen dioxide into contact with the etching target film in a heated state as the first etching step causes adsorption of the nitrogen dioxide onto a surface of the etching target film. Then, bringing an etching gas C containing the β-diketone into contact with the etching target film as the second etching step causes reaction of the β-diketone with the metal having an M-O bond energy of 5 eV or higher or the oxide of the metal, with the nitrogen dioxide being adsorbed on the surface. This forms a complex on the etching target film as in the case of the first dry etching method. This complex, which has a high vapor pressure, can etch the etching target film containing the metal having an M-O bond energy of 5 eV or higher or the oxide of the metal when the complex evaporates.

In the second dry etching method of the present disclosure, the above steps may be repeated multiple times so as to repeatedly etch the etching target film. Since one cycle of the etching steps can etch a certain thickness, a layer having a predetermined thickness can be precisely etched by specifying the number of cycles.

The oxide of hafnium constituting the oxide of the metal having an M-O bond energy of 5 eV or higher may be the same as that used for the first dry etching method.

The etching target film containing the metal having an M-O bond energy of 5 eV or higher or the oxide of the metal may be formed on a surface of the workpiece by any method. Examples of the method include a chemical vapor deposition (CVD) method and a sputtering method. The etching target film containing the metal having an M-O bond energy of 5 eV or higher or the oxide of the metal may have any thickness. For example, the etching target film may have a thickness of 0.1 nm or more and 1 μm or less.

The β-diketone may be the same as that used for the first dry etching method.

The etching gas C may consist only of the β-diketone and the etching gas B may consist only of the nitrogen dioxide, or the etching gases B and C each may further contain at least one additive gas selected from the group consisting of $O_2$, NO, $N_2O$, CO, $CO_2$, $H_2O$, $H_2O_2$, and alcohol. The etching gases B and C each may further contain at least one inert gas selected from the group consisting of $N_2$, Ar, He, Ne, and Kr. Examples of alcohols that can be used include methanol, ethanol, propanol, and isopropyl alcohol.

When the etching gas B contains additive gas(es) other than the nitrogen dioxide, the volume ratio of the nitrogen dioxide to the total of other additive gas(es) in the etching gas A may be the same as the volume ratio of the β-diketone to the nitrogen dioxide in the etching gas A.

When the etching gas C contains additive gas(es) other than the β-diketone, the volume ratio of the β-diketone to the total of other additive gas(es) contained in the etching gas C may be the same as the volume ratio of the β-diketone to the nitrogen dioxide in the etching gas A.

When the etching gas B and the etching gas C each contain an inert gas, the etching gas B and the etching gas C preferably each have an inert gas content of 1% by volume or more and 90% by volume or less, more preferably 10% by volume or more and 80% by volume or less, still more preferably 30% by volume or more and 50% by volume or less.

[Etching Device]

The dry etching method of the present disclosure can be performed, for example, using a common etching device used in a semiconductor production step. Such an etching device is also encompassed by the present disclosure.

FIG. 1 is a schematic view of an etching device according to one embodiment of the present disclosure.

An etching device 100 shown in FIG. 1 includes: a processing container 110 in which a workpiece 10 is to be placed, with a metal having an M-O bond energy of 5 eV or higher or an oxide of the metal formed on a surface of the workpiece 10; a β-diketone supply unit 140 connected to the processing container 110 and configured to supply a gaseous β-diketone; a nitrogen dioxide gas supply unit 150 configured to supply gaseous nitrogen dioxide; an inert gas supply unit 160 configured to supply an inert gas; and heating units 170 configured to heat the processing container 110. The etching device 100 may or may not include the inert gas supply unit 160.

The etching device 100 further includes a controller (not shown). For example, this controller is composed of a computer, and includes a program, a memory, and a CPU. In the program, a group of steps is incorporated to implement a series of operations in the first etching method or the second etching method. In accordance with the program, the controller adjusts the temperature of the workpiece 10, opens or closes the valves of the supply units, adjusts the flow rates of the gases, and adjusts the pressure in the processing container 110, for example. This program is stored in a computer storage medium such as a compact disk, a hard disk, a magneto-optical disk, or a memory card, and installed in the controller.

The processing container 110 includes a placement unit 111 on which the workpiece 10 is to be placed. The processing container 110 is not limited as long as the container is resistant to the β-diketone used and the pressure in the container can be reduced to a predetermined pressure. Usually, for example, a typical processing container installed in an etching device for semiconductors can be used. Also, the supply pipes for supplying etching gasses and the like and other pipes are not limited as long as they are resistant to β-diketones.

The β-diketone supply unit 140 controls the amount of supply using valves V1 and V2 and a mass flow controller MFC1 to supply a β-diketone from pipes 141 and 142 to the pipe 121.

The nitrogen dioxide gas supply unit 150 controls the amount of supply using valves V3 and V4 and a mass flow controller MFC2 to supply nitrogen dioxide from pipes 151 and 152 to the pipe 121.

The inert gas supply unit 160 controls the amount of supply using valves V5 and V6 and a mass flow controller MFC3 to supply an inert gas from pipes 161 and 162 to the pipe 121.

The heating units 170 which heat the processing container 110 are provided outside the processing container 110. A heater (not shown) may be provided inside the placement unit 111 as a second heating unit. When a plurality of placement units is installed in the processing container 110, each placement unit can be provided with a heater such that the workpieces on the placement units are set to the respective predetermined temperatures.

To one side of the processing container 110 is connected a gas exhauster that exhausts the reacted gasses. A vacuum pump 173 of the gas exhauster exhausts the reacted gasses from the processing container 110 through a pipe 171. The reacted gasses are collected by a liquid nitrogen trap 174 provided between the pipe 171 and a pipe 172. The pipes 171 and 172 can be respectively provided with valves V7 and V8 for pressure control. In FIG. 1, reference signs PI1 and PI2 each indicate a pressure indicator. Based on the pressure indicator readings, the controller can control the mass flow controllers and the valves.

The etching method is specifically described using the etching device 100 as an example.

[First Dry Etching Method Using the Above Etching Device]

In the first dry etching method of the present disclosure, the etching gas A containing the β-diketone and the nitrogen dioxide is brought into contact with the etching target film.

In the first dry etching method, first, the workpiece 10, on which the etching target film containing the metal having an M-O bond energy of 5 eV or higher or the oxide of the metal is formed, is placed in the processing container 110. Next, the vacuum pump 173 is used to evacuate, to a predetermined pressure, the inside of the processing container 110, the pipe 121, the pipes 141 and 142, the pipes 151 and 152, the pipes 161 and 162, the liquid nitrogen trap 174, and the pipes 171 and 172, followed by heating of the workpiece 10 with the heating units 170.

When the workpiece 10 reaches a predetermined temperature, the β-diketone supply unit 140 and the nitrogen dioxide gas supply unit 150 respectively supply the β-diketone and nitrogen dioxide gas to the pipe 121 at the respective predetermined flow rates. Here, the inert gas supply unit 160 may supply an inert gas to the pipe 121 at a predetermined flow rate.

The β-diketone and the nitrogen dioxide are mixed in predetermined proportions and supplied to the processing container 110. While the mixed etching gas is introduced into the processing container 110, the pressure in the processing container 110 is controlled to a predetermined pressure. The etching gas is reacted with the etching target film containing the metal having an M-O bond energy of 5 eV or higher or the oxide of the metal for a predetermined period of time, thus forming a complex to perform etching. This etching method enables non-plasma etching, i.e., etching in a non-plasma state, eliminating the need for excitation of the etching gas in plasma or the like during etching. The flow rate of the etching gas may be appropriately set according to the capacity, pressure, and the like of the processing container.

Etching in a plasma state refers to etching involving generating low-temperature gas plasma in a reaction vessel by introducing a gas or the like at a pressure of about 0.1 to 10 Torr into the reaction vessel and applying a high-frequency power to an outer coil or a counter electrode, and performing etching with active species such as ions or radicals generated in the reaction vessel.

The dry etching method of the present disclosure brings gas into contact with the target film in a non-plasma state, enabling dry etching without generating the above gas plasma.

After completion of the etching step, heating with the heating units 170 is stopped to drop the temperature. The vacuum pump 173 is also stopped, followed by purging with an inert gas to release the vacuum. As described above, the first dry etching method using the above etching device can etch an etching target film containing a metal having an M-O bond energy of 5 eV or higher or an oxide of the metal.

(Etching Conditions for First Dry Etching Method)

In the first dry etching method of the present disclosure, the temperature of the etching target film when the etching gas A is brought into contact with the etching target film may be any temperature at which the complex is evaporable. In particular, the temperature of the etching target film to be removed is preferably 250° C. or higher and 375° C. or lower, more preferably 275° C. or higher and 375° C. or lower, more preferably 275° C. or higher and 350° C. or lower, more preferably 275° C. or higher and 325° C. or lower.

When the etching gas A is brought into contact with the etching target film, the pressure in the processing container in which the workpiece with the etching target film formed thereon is placed is not limited, but is usually in a pressure range of 0.1 kPa or higher and 101.3 kPa or lower.

The pressure in the processing container during the etching step is preferably 20 Torr or higher and 300 Torr or lower (2.67 kPa or higher and 39.9 kPa or lower), more preferably 20 Torr or higher and 200 Torr or lower (2.67 kPa or higher and 26.7 kPa or lower), still more preferably 20 Torr or higher and 100 Torr or lower (2.67 kPa or higher and 13.3 kPa or lower), in order to achieve a sufficient etching rate.

The processing time for the etching step is not limited, and is preferably within 60 minutes in consideration of the efficiency of the semiconductor device production process. Here, the processing time for the etching step refers to the time from introduction of an etching gas to the processing container in which the workpiece is placed to exhaustion of the etching gas in the processing container with a vacuum pump or the like for termination of the etching process.

[Second Dry Etching Method Using Etching Device 100]

The second dry etching method of the present disclosure includes the first etching step of bringing the etching gas B containing the nitrogen dioxide into contact with the etching target film and the second etching step of bringing the etching gas C containing the β-diketone into contact with the etching target film.

In the second dry etching method, first, the workpiece 10, on which the etching target film containing the metal having an M-O bond energy of 5 eV or higher or the oxide of the metal is formed, is placed in the processing container 110. Next, the vacuum pump 173 is used to evacuate, to a predetermined pressure, the inside of the processing container 110, the pipe 121, the pipes 141 and 142, the pipes 151 and 152, the pipes 161 and 162, the liquid nitrogen trap 174, and the pipes 171 and 172, followed by heating of the workpiece 10 with the heating units 170.

When the workpiece 10 reaches a predetermined temperature, first, the nitrogen dioxide gas supply unit 150 supplies nitrogen dioxide gas to the pipe 121 at a predetermined flow rate. Here, the inert gas supply unit 160 may supply an inert gas to the pipe 121 at a predetermined flow rate. While the nitrogen dioxide gas or the nitrogen dioxide gas and inert gas is/are introduced into the processing container 110, the pressure in the processing container 110 is controlled to a predetermined pressure. Introducing the nitrogen dioxide gas into the processing container 110 for a predetermined period of time allows nitrogen dioxide to be adsorbed on the etching target film.

After the gas containing the nitrogen dioxide gas is evacuated, the β-diketone supply unit 140 supplies a β-diketone gas to the pipe 121 at a predetermined flow rate. Here, the inert gas supply unit 160 may supply an inert gas to the pipe 121 at a predetermined flow rate. While the β-diketone gas or the β-diketone gas and inert gas is/are introduced into the processing container 110, the pressure in the processing container 110 is controlled to a predetermined pressure. Introducing the β-diketone gas into the processing container 110 for predetermined time causes reaction of the previously adsorbed nitrogen dioxide with the β-diketone, forming a complex. The complex further reacts with the etching target film, thus etching the etching target film.

In the second dry etching method of the present disclosure, the first etching step of introducing the nitrogen dioxide gas into the processing container 110 and the second etching step of introducing the β-diketone into the processing container 110, which are defined as one cycle, may be repeated for multiple cycles.

In the second dry etching method of the present disclosure, the thickness of the etching target film that can be etched in one cycle can be controlled by setting the etching conditions for one cycle to predetermined conditions. When the thickness of the etching target film that can be etched in one cycle is set to be thin, the thickness to be etched can be precisely controlled.

The second dry etching method also enables non-plasma etching, i.e., etching in a non-plasma state, thus eliminating the need for excitation of the etching gas in the plasma or the like during etching. The flow rates of the nitrogen dioxide and the β-diketone may be appropriately set according to the capacity, pressure, and the like of the processing container.

As described above, the second dry etching method using the etching device of the present disclosure can bring gas into contact with the etching target film in a non-plasma state, enabling dry etching without generating the above gas plasma.

After completion of the etching steps, heating with the heating units 170 is stopped to drop the temperature. The vacuum pump 173 is also stopped, followed by purging with an inert gas to release the vacuum. Through the above procedure, the etching target film containing the metal having an M-O bond energy of 5 eV or higher or the oxide of the metal can be etched.

(Etching Conditions for Second Dry Etching Method)

In the second dry etching method of the present disclosure, the temperature of the etching target film in the etching steps may be any temperature at which the complex is evaporable. In particular, the temperature of the etching target film to be removed is more preferably 250° C. or higher and 375° C. or lower, more preferably 275° C. or higher and 375° C. or lower, more preferably 275° C. or higher and 350° C. or lower, more preferably 275° C. or higher and 325° C. or lower. The temperature of the etching target film is preferably the same in the first etching step and in the second etching step.

The pressure in the processing container in the etching steps is not limited, but is usually in a pressure range of 0.1 kPa or higher and 101.3 kPa or lower.

The pressure in the processing container in the first etching step and the second etching step is preferably 20

Torr or higher and 300 Torr or lower (2.67 kPa or higher and 39.9 kPa or lower), more preferably 20 Torr or higher and 200 Torr or lower (2.67 kPa or higher and 26.7 kPa or lower), still more preferably 20 Torr or higher and 100 Torr or lower (2.67 kPa or higher and 13.3 kPa or lower), in order to achieve a sufficient etching rate. The pressure in the processing container in the second etching step is preferably higher than the pressure in the processing container in the first etching step.

The processing time for the first etching step and the second etching step is not limited. The processing time for the first etching step in one cycle is preferably within 60 minutes. The processing time for the second etching step in one cycle is preferably within 60 minutes. Here, the processing time for the etching step refers to the time from introduction of an etching gas to the processing container in which the workpiece is placed to exhaustion of the etching gas in the processing container with a vacuum pump or the like for termination of the etching process.

[Method of Producing Semiconductor Device]

The dry etching method of the present disclosure described above is usable as an etching method for formation of a predetermined pattern on a film of an oxide of hafnium, hafnium metal, or the like in a conventional semiconductor device. Etching a film of an oxide of hafnium, hafnium metal, or the like on a substrate by the dry etching method of the present disclosure enables inexpensive production of a semiconductor device.

EXAMPLES

Hereinafter, examples that specifically disclose the present disclosure are described. The present disclosure is not limited to these examples.

Example 1

A workpiece 10 having an etching target film formed on a surface of a silicon wafer was etched using the etching device 100 shown in FIG. 1. The etching target film included a hafnium oxide ($HfO_2$) film (shape 1 cm×1 cm, film thickness 5 nm).

The inside of the processing container 110, the pipe 121, the pipes 141 and 142, the pipes 151 and 152, the pipes 161 and 162, the liquid nitrogen trap 174, and the pipes 171 and 172 was evacuated to lower than 10 Pa. Then, the workpiece 10, placed on the placement unit 111, was heated with the heating units 170 and the heater installed in the placement unit 111. After confirmation that the temperature of the workpiece 10 reached 300° C., gaseous hexafluoroacetylacetone (HFAc) and $NO_2$ gas respectively from the β-diketone supply unit 140 and the nitrogen dioxide gas supply unit 150 were supplied to the pipe 121 at the respective predetermined flow rates. While the etching gases were thereby introduced into the processing container 110, the pressure inside the processing container 110 was controlled to 90 Torr to perform the etching step. The temperature of the workpiece was 300° C. The etching gas flow rates were as follows: HFAc=10 sccm, $NO_2$=1 sccm. After 30 minutes from the start of the introduction of the etching gases, the introduction of the etching gases was stopped. The inside of the processing container 110 was then evacuated to lower than 10 Pa, and purged with $N_2$ gas supplied from the inert gas supply unit 160 before the workpiece 10 was taken out. The film thickness was measured to evaluate the etching amount.

In Examples 1 to 22 including Examples 2 to 20 below, the first dry etching method was used in which an etching gas A containing a β-diketone and nitrogen dioxide is brought into contact with an etching target film. Similarly in Comparative Examples 1 to 17 excluding Comparative Examples 4, 7, 10, 12, and 17, an etching gas containing a β-diketone and a gas shown in Table 1 or 2 was brought into contact with the etching target film. In Comparative Examples 4, 7, 10, 12, and 17, an etching gas containing only a β-diketone was brought into contact with the etching target film.

Examples 2 to 4 and Comparative Examples 1 to 4

Table 1 below shows the type of additive gas, the flow rate of HFAc, the flow rate of the additive gas, the pressure in the processing container, the temperature in etching, the etching time, and the quality of etching in the etching described above.

The quality of etching was determined as "Good" when the etching rate was 0.1 nm/min or more, or "Poor" when the etching rate was less than 0.1 nm/min. The etching rate refers to the change in film thickness before and after etching divided by the time needed for etching.

The following explains where Examples 2 to 4 and Comparative Examples 1 to 4 differ from Example 1. In Example 2, the flow rate of $NO_2$ as an additive gas was changed. In Example 3, the flow rate of $NO_2$ as an additive gas, the etching time, and the temperature of the workpiece 10 were changed. In Example 4, the temperature of the workpiece 10 was changed. In Comparative Examples 1 to 3, respectively, nitrogen monoxide (NO), oxygen ($O_2$), and dinitrogen monoxide ($N_2O$) were used as additive gases. In Comparative Example 4, no additive gas was used. The operations were otherwise performed in the same manner as in Example 1, and the quality of etching of the hafnium oxide ($HfO_2$) film was evaluated.

TABLE 1

| | Etching target film | Additive gas | Gas flow rate [sccm] | | Pressure Torr | Temperature [° C.] | Time [min] | Quality of etching |
| --- | --- | --- | --- | --- | --- | --- | --- | --- |
| | | | HFAc | Additive gas | | | | |
| Example 1 | $HfO_2$ | $NO_2$ | 10 | 1 | 90 | 300 | 30 | Good |
| Example 2 | $HfO_2$ | $NO_2$ | 10 | 5 | 90 | 300 | 30 | Good |
| Example 3 | $HfO_2$ | $NO_2$ | 10 | 5 | 90 | 350 | 10 | Good |
| Example 4 | $HfO_2$ | $NO_2$ | 10 | 1 | 90 | 275 | 30 | Good |
| Comparative Example 1 | $HfO_2$ | NO | 10 | 1 | 90 | 300 | 30 | Poor |
| Comparative Example 2 | $HfO_2$ | $O_2$ | 10 | 1 | 90 | 300 | 30 | Poor |

TABLE 1-continued

| | Etching target film | Additive gas | Gas flow rate [sccm] HFAc | Additive gas | Pressure Torr | Temperature [° C.] | Time [min] | Quality of etching |
|---|---|---|---|---|---|---|---|---|
| Comparative Example 3 | HfO$_2$ | N$_2$O | 10 | 1 | 90 | 300 | 30 | Poor |
| Comparative Example 4 | HfO$_2$ | None | 10 | 0 | 90 | 300 | 30 | Poor |

Examples 5 to 22 and Comparative Examples 5 to 17

A workpiece having an etching target film formed on a surface of a silicon wafer was etched using the etching device 100 shown in FIG. 1. The etching target film included an aluminum oxide (Al$_2$O$_3$) film, a zirconium oxide (ZrO$_2$) film, a hafnium oxide (HfO$_2$) film, or a titanium oxide (TiO$_2$) film having a shape of 1 cm×1 cm and a film thickness of 60 nm.

The operations were performed in the same manner as in Example 1 except that the material of the etching target film, the type and flow rate of the etching gases, the pressure in the processing container, and the temperature of the workpiece in etching (275° C., 300° C., 350° C.) were changed as shown in Table 2. The etching rate for the etching target film was measured. Table 2 shows the results.

In Table 2, A indicates an etching rate of 0.1 nm/min or more and less than 1.0 nm/min, B indicates an etching rate of 1.0 nm/min or more and less than 10.0 nm/min, C indicates an etching rate of 10.0 nm/min or more and less than 50.0 nm/min, and X indicates an etching rate of less than 0.1 nm.

TABLE 2

| | Etching target film | Gas type/flow rate [sccm] | [sccm] | Pressure (Torr) | Etching rate at the following temperatures 275° C. | 300° C. | 350° C. |
|---|---|---|---|---|---|---|---|
| Example 5 | Al$_2$O$_3$ | HFAc/10 | NO$_2$/5 | 90 | B | B | C |
| Example 6 | Al$_2$O$_3$ | HFAc/10 | NO$_2$/1 | 90 | A | B | B |
| Example 7 | Al$_2$O$_3$ | HFAc/10 | NO$_2$/5 | 120 | B | B | C |
| Example 8 | Al$_2$O$_3$ | HFAc/10 | NO$_2$/5 | 60 | A | B | C |
| Comparative Example 5 | Al$_2$O$_3$ | HFAc/10 | NO/5 | 90 | X | X | X |
| Comparative Example 6 | Al$_2$O$_3$ | HFAc/10 | O$_2$/5 | 90 | X | X | X |
| Comparative Example 7 | Al$_2$O$_3$ | HFAc/10 | — | 90 | X | X | X |
| Example 9 | ZrO$_2$ | HFAc/10 | NO$_2$/5 | 90 | A | A | B |
| Example 10 | ZrO$_2$ | HFAc/10 | NO$_2$/1 | 90 | A | A | B |
| Example 11 | ZrO$_2$ | HFAc/10 | NO$_2$/5 | 120 | A | A | B |
| Example 12 | ZrO$_2$ | HFAc/10 | NO$_2$/5 | 60 | A | A | B |
| Comparative Example 8 | ZrO$_2$ | HFAc/10 | NO/5 | 90 | X | X | X |
| Comparative Example 9 | ZrO$_2$ | HFAc/10 | O$_2$/5 | 90 | X | X | X |
| Comparative Example 10 | ZrO$_2$ | HFAc/10 | — | 90 | X | X | X |
| Example 13 | HfO$_2$ | HFAc/10 | NO$_2$/5 | 90 | A | B | B |
| Example 14 | HfO$_2$ | HFAc/10 | NO$_2$/1 | 90 | A | A | A |
| Example 15 | HfO$_2$ | HFAc/10 | NO$_2$/5 | 120 | A | B | B |
| Example 16 | HfO$_2$ | HFAc/10 | NO$_2$/5 | 60 | A | B | B |
| Comparative Example 11 | HfO$_2$ | HFAc/10 | N$_2$O/5 | 90 | X | X | X |
| Comparative Example 12 | HfO$_2$ | HFAc/10 | — | 90 | X | X | X |
| Example 17 | Hf | HFAc/10 | NO$_2$/5 | 90 | A | B | C |
| Example 18 | Hf | HFAc/10 | NO$_2$/1 | 90 | A | A | B |
| Comparative Example 13 | Hf | HFAc/10 | NO/5 | 90 | X | X | X |
| Comparative Example 14 | Hf | HFAc/10 | O$_2$/5 | 90 | X | X | X |
| Example 19 | TiO$_2$ | HFAc/10 | NO$_2$/5 | 90 | A | A | A |
| Example 20 | TiO$_2$ | HFAc/10 | NO$_2$/1 | 90 | A | A | A |
| Example 21 | TiO$_2$ | HFAc/10 | NO$_2$/5 | 120 | A | A | A |
| Example 22 | TiO$_2$ | HFAc/10 | NO$_2$/5 | 60 | A | A | A |
| Comparative Example 15 | TiO$_2$ | HFAc/10 | NO/5 | 90 | X | X | X |
| Comparative Example 16 | TiO$_2$ | HFAc/10 | O$_2$/5 | 90 | X | X | X |

TABLE 2-continued

| | Etching target film | Gas type/flow rate | | Pressure (Torr) | Etching rate at the following temperatures | | |
|---|---|---|---|---|---|---|---|
| | | [sccm] | [sccm] | | 275° C. | 300° C. | 350° C. |
| Comparative Example 17 | TiO$_2$ | HFAc/10 | — | 90 | X | X | X |

The above results show that using HFAc and NO$_2$ as etching gases enabled etching of an aluminum oxide film, a zirconium oxide film, a hafnium oxide film, a hafnium metal film, and a titanium oxide film at a workpiece temperature of 350° C. or lower and a rate of 0.1 nm/min or more. In particular, the films were etched even at a workpiece temperature of 300° C. Moreover, no carbon film was formed on the workpiece surface in Examples 1 to 4 because the films were etched at a workpiece temperature not higher than the decomposition temperature of HFAc (375° C.)

In contrast, using NO, O$_2$, or N$_2$O as an additive gas or using no additive gas resulted in failure to etch an aluminum oxide film, a zirconium oxide film, a hafnium oxide film, a hafnium metal film, and a titanium oxide film even at a workpiece temperature of 350° C.

Examples 23 to 26

In each of these examples, an etching target film formed on a surface of a silicon wafer and including a hafnium oxide (HfO$_2$) film (shape 1 cm×1 cm, film thickness 60 nm) was etched. The etching was performed by the second dry etching method including repeating a first etching step of bringing an etching gas B containing nitrogen dioxide into contact with an etching target film and a second etching step of bringing an etching gas C containing a β-diketone into contact with the etching target film.

The inside of the processing container 110, the pipe 121, the pipes 141 and 142, the pipes 151 and 152, the pipes 161 and 162, the liquid nitrogen trap 174, and the pipes 171 and 172 was evacuated to lower than 10 Pa. Then, the workpiece 10 with the hafnium oxide (HfO$_2$) film, placed on the placement unit 111, was heated with the heating units 170 and the heater installed in the placement unit 111.

After confirmation that the temperature of the workpiece 10 reached 350° C., NO$_2$ gas was supplied to the pipe 121 from the nitrogen dioxide gas supply unit 150, and carried into the processing container 110 while the pressure in the processing container 110 was controlled at 30 Torr. The temperature of the workpiece was 350° C., and the etching gas flow rate was as follows: NO$_2$=5 sccm. The NO$_2$ gas was supplied for the time shown in Table 3 and brought into contact with the etching target film. The introduction of the etching gas was then stopped, and the inside of the processing container 110 was evacuated to lower than 10 Pa.

Next, gaseous hexafluoroacetylacetone (HFAc) was supplied to the pipe 121 from the β-diketone supply unit 140, and the HFAc gas was carried into the processing container 110 while the pressure in the processing container 110 was controlled at 60 Torr. The temperature of the workpiece was 350° C. The etching gas flow rate was as follows: HFAc=10 sccm. The HFAc gas was supplied for the time shown in Table 3 and brought into contact with the etching target film. The introduction of the etching gas was then stopped, and the inside of the processing container 110 was evacuated to lower than 10 Pa.

The step of carrying NO$_2$ gas into the processing container 110 and the step of carrying HFAc gas into the processing container 110 above, which are defined as one cycle, were repeated the number of times (number of cycles) shown in Table 3. Thereafter, the inside of the processing container 110 was evacuated to lower than 10 Pa, and purged with N$_2$ gas supplied from the inert gas supply unit 160 before the workpiece 10 was taken out. The film thickness was measured to measure the total etched thickness and also to calculate the etched thickness per cycle. Table 3 shows the results.

TABLE 3

| | NO$_2$ etching conditions (one cycle) | | | | HFAc etching conditions (one cycle) | | | | | Etched | |
|---|---|---|---|---|---|---|---|---|---|---|---|
| | Flow rate [sccm] | Pressure [Torr] | Temperature [° C.] | Time [min] | Flow rate [sccm] | Pressure [Torr] | Temperature [° C.] | Time [min] | Cycle number | Etched thickness [nm] | thickness per cycle [nm] |
| Example 23 | 5 | 30 | 350 | 2 | 10 | 60 | 350 | 2 | 10 | 2.5 | 0.25 |
| Example 24 | 5 | 30 | 350 | 2 | 10 | 60 | 350 | 2 | 20 | 5.4 | 0.27 |
| Example 25 | 5 | 30 | 350 | 2 | 10 | 60 | 350 | 4 | 15 | 3.4 | 0.22 |
| Example 26 | 5 | 30 | 350 | 5 | 10 | 60 | 350 | 4 | 15 | 3.7 | 0.25 |

The results shown in Table 3 clearly indicate that under constant etching conditions, the thickness of the etching target film that can be etched per cycle is substantially constant. This shows that setting the number of cycles allows an etching target film to be etched almost exactly by a desired thickness.

REFERENCE SIGNS LIST 10 workpiece
100 etching device
110 processing container
111 placement unit
121 pipe
140 β-diketone supply unit
141, 142 pipe
150 nitrogen dioxide gas supply unit
151, 152 pipe
160 inert gas supply unit 161, 162 pipe
170 heating unit
171, 172 pipe
173 vacuum pump
174 liquid nitrogen trap
MFC1, MFC2, MFC3 mass flow controller
PI1, PI2 pressure indicator
V1, V2, V3, V4, V5, V6, V7, V8 valve

The invention claimed is:

1. A dry etching method comprising
reacting an etching target film formed on a surface of a workpiece with a β-diketone and nitrogen dioxide to etch the etching target film in a non-plasma state,
the etching target film containing a metal having an M-O bond energy of 5 eV or higher or an oxide of the metal.

2. The dry etching method according to claim 1,
wherein the metal having an M-O bond energy of 5 eV or higher or the oxide of the metal is at least one selected from the group consisting of an oxide of hafnium, an oxide of zirconium, an oxide of titanium, an oxide of aluminum, hafnium metal, zirconium metal, titanium metal, and aluminum metal.

3. The dry etching method according to claim 1,
wherein the etching target film is at least one film selected from the group consisting of a film of an oxide of hafnium, a film of an oxide of zirconium, a film of an oxide of titanium, a film of an oxide of aluminum, a hafnium metal film, a zirconium metal film, a titanium metal film, and an aluminum metal film.

4. The dry etching method according to claim 1,
wherein the β-diketone is hexafluoroacetylacetone or trifluoroacetylacetone.

5. The dry etching method according to claim 1,
wherein an etching gas A containing the β-diketone and the nitrogen dioxide is brought into contact with the etching target film.

6. The dry etching method according to claim 5,
wherein the etching target film has a temperature of 250° C. or higher and 375° C. or lower when the etching gas A is brought into contact with the etching target film.

7. The dry etching method according to claim 5,
wherein a volume ratio of the β-diketone to the nitrogen dioxide in the etching gas A satisfies β-diketone: nitrogen dioxide=10:0.001 or more and 100 or less.

8. The dry etching method according to claim 7,
wherein the volume ratio of the β-diketone to the nitrogen dioxide in the etching gas A satisfies β-diketone: nitrogen dioxide=10:0.01 or more and 10 or less.

9. The dry etching method according to claim 5,
wherein a pressure in a processing container in which the workpiece with the etching target film formed thereon is placed is in a pressure range of 0.1 kPa or higher and 101.3 kPa or lower when the etching gas A is brought into contact with the etching target film.

10. The dry etching method according to claim 5,
wherein the etching target film is a film containing at least one selected from the group consisting of hafnium oxide represented by $HfO_x$ wherein x is 1 or greater and 3 or smaller, zirconium oxide represented by $ZrO_u$ wherein u is 1 or greater and 3 or smaller, aluminum oxide represented by $AlO_v$ wherein v is 1 or greater and 2 or smaller, and titanium oxide represented by $TiO_w$ wherein w is 1 or greater and 3 or smaller;
the β-diketone is hexafluoroacetylacetone;
the etching target film has a temperature of 250° C. or higher and 375° C. or lower when the β-diketone and the nitrogen dioxide are brought into contact with the etching target film;
a volume ratio of the β-diketone to the nitrogen dioxide in the etching gas A satisfies β-diketone: nitrogen dioxide=10:0.001 or more and 100 or less;
a pressure in a processing container in which the workpiece with the etching target film formed thereon is placed is in a pressure range of 0.1 kPa or higher and 101.3 kPa or lower when the etching gas A is brought into contact with the etching target film; and
an etching rate for the etching target film is 0.1 nm/min or more.

11. The dry etching method according to claim 5,
wherein the etching gas A further contains at least one inert gas selected from the group consisting of $N_2$, Ar, He, Ne, and Kr.

12. The dry etching method according to claim 11,
wherein the etching gas A has an inert gas content of 1% by volume or more and 90% by volume or less.

13. The dry etching method according to claim 11,
wherein the etching gas A has an inert gas content of 30% by volume or more and 50% by volume or less.

14. The dry etching method according to claim 1, including:
a first etching step of bringing an etching gas B containing the nitrogen dioxide into contact with the etching target film; and
a second etching step of bringing an etching gas C containing the β-diketone into contact with the etching target film.

15. The dry etching method according to claim 14,
wherein the first etching step and the second etching step are repeated for multiple cycles.

16. The dry etching method according to claim 14,
wherein the etching target film has a temperature of 250° C. or higher and 375° C. or lower when the etching gas B is brought into contact with the etching target film and when the etching gas C is brought into contact with the etching target film.

17. The dry etching method according to claim 14,
wherein a pressure in a processing container in which the workpiece with the etching target film formed thereon is placed is in a pressure range of 0.1 kPa or higher and 101.3 kPa or lower when the etching gas B is brought into contact with the etching target film and when the etching gas C is brought into contact with the etching target film.

18. The dry etching method according to claim 14,
wherein the etching target film is a film containing at least one selected from the group consisting of hafnium oxide represented by $HfO_x$ wherein x is 1 or greater and 3 or smaller, zirconium oxide represented by $ZrO_u$ wherein u is 1 or greater and 3 or smaller, aluminum oxide represented by $AlO_v$ wherein v is 1 or greater and 2 or smaller, and titanium oxide represented by $TiO_w$ wherein w is 1 or greater and 3 or smaller;
the β-diketone is hexafluoroacetylacetone;
the etching target film has a temperature of 250° C. or higher and 375° C. or lower when the etching gas B is brought into contact with the etching target film and when the etching gas C is brought into contact with the etching target film; and
a pressure in a processing container in which the workpiece with the etching target film formed thereon is placed is in a pressure range of 0.1 kPa or higher and 101.3 kPa or lower when the etching gas B is brought into contact with the etching target film and when the etching gas C is brought into contact with the etching target film.

19. The dry etching method according to claim 14, wherein the etching gas B and the etching gas C each further contain at least one inert gas selected from the group consisting of $N_2$, Ar, He, Ne, and Kr.

20. The dry etching method according to claim 19, wherein the etching gas B and the etching gas C each have an inert gas content of 1% by volume or more and 90% by volume or less.

21. The dry etching method according to claim 20, wherein the etching gas B and the etching gas C each have an inert gas content of 30% by volume or more and 50% by volume or less.

22. A method of producing a semiconductor device, comprising
a step of reacting an etching target film on a substrate with a β-diketone and nitrogen dioxide to etch the etching target film in a non-plasma state,
the etching target film containing a metal having an M-O bond energy of 5 eV or higher or an oxide of the metal.

23. The method of producing a semiconductor device according to claim 22, wherein the etching target film is at least one film selected from the group consisting of a film of an oxide of hafnium, a film of an oxide of zirconium, a film of an oxide of titanium, a film of an oxide of aluminum, a hafnium metal film, a zirconium metal film, a titanium metal film, and an aluminum metal film.

* * * * *